(12) United States Patent
Wu et al.

(10) Patent No.: US 10,833,511 B2
(45) Date of Patent: Nov. 10, 2020

(54) BATTERY CELL MANAGEMENT AND BALANCE CIRCUIT, METHOD, AND BATTERY SYSTEM

(71) Applicant: NATIONAL CHUNG SHAN INSTITUTE OF SCIENCE AND TECHNOLOGY, Taoyuan (TW)

(72) Inventors: Chi-Sheng Wu, Taoyuan (TW);
Gwo-Huei You, Taoyuan (TW);
Hsuang-Chang Chiang, Miaoli (TW);
Tsang-Li Tai, Miaoli (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 98 days.

(21) Appl. No.: 15/834,102

(22) Filed: Dec. 7, 2017

(65) Prior Publication Data
US 2019/0181653 A1     Jun. 13, 2019

(51) Int. Cl.
*H02J 7/00*     (2006.01)
*B60L 58/14*    (2019.01)
*B60L 58/22*    (2019.01)
*B60L 58/15*    (2019.01)
*B60L 58/21*    (2019.01)
*G01R 31/36*    (2020.01)
(Continued)

(52) U.S. Cl.
CPC .......... *H02J 7/0014* (2013.01); *B60L 58/13* (2019.02); *B60L 58/14* (2019.02); *B60L 58/15* (2019.02); *B60L 58/21* (2019.02); *B60L 58/22* (2019.02); *G01R 31/36* (2013.01); *H02J 7/0018* (2013.01); *H02J 7/0077* (2013.01); *H02J 7/045* (2013.01); *H02J 7/0026* (2013.01)

(58) Field of Classification Search
CPC .................................................... H02J 7/0014
USPC ...................................................... 320/118
See application file for complete search history.

(56) References Cited

U.S. PATENT DOCUMENTS

2007/0090798 A1* 4/2007 Yun ................. B60L 3/0038
                                                    320/116
2007/0268000 A1* 11/2007 Kobayashi ......... H02J 7/0019
                                                    320/118
(Continued)

*Primary Examiner* — Edward Tso
*Assistant Examiner* — Ahmed H Omar
(74) *Attorney, Agent, or Firm* — Schmeiser, Olsen & Watts, LLP

(57) ABSTRACT

A battery cell management and balance circuit comprises multiple battery cell balance circuits, multiple battery cell monitor units, multiple battery module balance circuits and a battery management unit. The battery cell balance circuits connect to battery cells for executing a first charge or discharge command. The battery cell monitor units monitor battery cells for generating battery cell information and the first charge or discharge commands. The battery module balance circuits connect to battery modules for executing second charge or discharge commands. The battery management unit connect to the battery cell monitor units for receiving battery cell information and the battery module balance circuits for direct or indirectly generating the second charge or discharge commands to the battery module balance circuits. A battery system and a battery cell management and balance circuit method is also introduced.

12 Claims, 7 Drawing Sheets

(51) Int. Cl.
*H02J 7/04* (2006.01)
*B60L 58/13* (2019.01)

(56) References Cited

U.S. PATENT DOCUMENTS

| | | | |
|---|---|---|---|
| 2012/0086390 A1* | 4/2012 | Lim | H02J 7/0019 |
| | | | 320/107 |
| 2013/0057293 A1* | 3/2013 | Miyamoto | G01R 31/025 |
| | | | 324/433 |
| 2014/0084868 A1* | 3/2014 | Yun | H02J 7/0063 |
| | | | 320/118 |
| 2018/0152028 A1* | 5/2018 | Hsiao | H01M 10/482 |

* cited by examiner

BATTERY CELL MANAGEMENT AND BALANCE CIRCUIT, METHOD, AND BATTERY SYSTEM

FIELD OF THE INVENTION

The present disclosure relates to a battery cell management and balance circuit and, more particularly, to a high efficiency battery cell management and balance circuit implemented in a high voltage BEV (battery electric vehicle) power system.

BACKGROUND OF THE INVENTION

Referring to FIG. 1, FIG. 1 shows a conventional battery system 1000 which has a plurality of battery cells 1100. The plurality of battery cells 1100 are identical to each other and have the same nominal voltage, for example, 3.7V or 4.2V per cell.

In FIG. 1, four battery cells 1100 arrange in series to become a battery module (or battery pack) 1200, forty battery modules 1200 arrange in series to become a battery unit 1300. The battery units 1300 have an output end 1310 and an input end 1320, wherein the output end 1310 is connected and uninterruptedly supplying power to loads, and the input end 1320 is used to be charged. The numbers of the battery cells 1100, battery modules 1200, and battery unit 1300, depending on desire output voltage and/or other design consideration, can be different from this case in other conventional battery systems.

The conventional battery system 1000 can be applied to a battery electric vehicle, for example, an electric bus. The output end 1310 of conventional battery system 1000 can connect to electric bus motor(s) for power supply. While the electric bus travels, the electric bus motor(s) keeps running and electric power stored in the conventional battery system 1000 is consumed. Electric power stored in the conventional battery system 1000 can be added in the electric bus charging process.

After few cycles of the conventional battery system charging and discharging process, some battery cells 1100 (or battery modules 1200) of conventional battery system 1000 may be overcharged while some others battery cells 1100 (or battery modules 1200) of conventional battery system 1000 may be over discharged. This unbalanced state may cause great and irreversible damages to conventional battery system 1000, for example, significantly capacity and life time reduction.

Accordingly, it is imperative to provide a high efficiency battery cell management and balance circuit which can implement in a high voltage BEV (battery electric vehicle) power system and overcomes the aforesaid drawbacks of the conventional battery system 1000.

SUMMARY OF THE INVENTION

In view of the aforesaid drawbacks of the prior art, it is an objective of the present disclosure to provide a battery cell management and balance circuit, method and battery system which can implement in a high voltage BEV (battery electric vehicle) power system, features a high efficiency management and balance strategy and achieves high speed voltage balance ability.

In order to achieve the above and other objectives, the present disclosure provides a battery cell management and balance circuit implemented in a battery system. The battery system has M battery modules connected and arranged in series. Each of battery modules has N battery cells connected and arranged in series.

The battery cell management and balance circuit comprises M×N battery cell balance circuits, M battery cell monitor units, M battery module balance circuits and a battery management unit.

Each of the battery cell balance circuits connects to a battery cell of the M×N battery cells for executing a first charge or discharge command to the connected battery cell. Each of the M battery cell monitor units monitors N battery cells of the M×N battery cells and corresponding to the N battery cell balance circuits connected to the N battery cell for generating battery cell information and the first charge or discharge commands.

Each of the M battery module balance circuits connects to a battery module of the M battery modules for executing second charge or discharge commands to the connected battery module. A battery management unit connects to the M battery cell monitor units for receiving battery cell information from each battery cell monitor unit and the M battery module balance circuits for direct or indirectly generating the second charge or discharge commands to the M battery module balance circuits.

Regarding the battery cell management and balance circuit, each of the battery cell monitor units generates the first charge command to one battery cell balance circuit with a lowest monitored voltage among the N corresponding battery cell balance circuits and the first discharge command to another battery cell balance circuit with a highest monitored voltage among the N corresponding battery cell balance circuits.

Regarding the battery cell management and balance circuit, the battery management unit generates the second charge command to one battery module balance circuit with a lowest monitored voltage among the M corresponding battery module balance circuits and the second discharge command to another battery module balance circuit with a highest monitored voltage among the N corresponding battery module balance circuits.

In order to achieve the above and other objectives, the present disclosure provides a battery system. The battery system comprises M battery modules, M×N battery cells, M×N battery cell balance circuits, M battery cell monitor units, M battery module balance circuits and a battery management unit.

Each of the M battery modules connected and arranged in series, each of battery modules having N battery cells connected and arranged in series. Each of the battery cell balance circuits connects to a battery cell of the M×N battery cells for generating a first charge or discharge command to the connected battery cell. Each of the M battery cell monitor units monitors N battery cells of the M×N battery cells and corresponding to the N battery cell balance circuits connected to the N battery cell for generating battery cell information.

Each of the M battery module balance circuits connects to a battery module of the M battery modules for executing a second charge or discharge commands to the connected battery module. A battery management unit connects to the M battery cell monitor units for receiving battery cell information from each battery cell monitor unit and the M battery module balance circuits for directly or indirectly generating the second charge or discharge commands to the M battery module balance circuits.

Regarding the battery system, each of the battery cell monitor units generates the first charge command to one battery cell balance circuit with a lowest monitored voltage among the N corresponding battery cell balance circuits and the first discharge command to another battery cell balance circuit with a highest monitored voltage among the N corresponding battery cell balance circuits.

Regarding the battery system, the battery management unit generates the second charge command to one battery module balance circuit with a lowest monitored voltage between the M corresponding battery module balance circuits and the second discharge command to another battery module balance circuit with a highest monitored voltage between the N corresponding battery module balance circuits.

Regarding the battery system, a battery cell monitor unit of the M battery cell monitor units does not generate the first charge and discharge commands when the difference voltage value between the highest and lowest monitored voltages among the N corresponding battery cell balance circuits does not reach a first threshold value.

Regarding the battery system, the battery management unit does not generate the second charge and discharge commands when the difference voltage value between the highest and lowest monitored voltages between the M corresponding battery module balance circuits does not reach a second threshold value.

Regarding the battery system, the first threshold value equals to 5% of the lowest monitored voltages among the N corresponding battery cell balance circuits.

Regarding the battery system, the second threshold value equals to 5% of the lowest monitored voltages among the M corresponding battery module balance circuits.

In order to achieve the above and other objectives, the present disclosure provides a battery cell management and balance method implemented in a battery system. The battery system has M battery modules connected and arranged in series. Each of the battery modules has N battery cells connected and arranged in series.

The battery cell management and balance method comprises (a) a battery cell monitoring step of monitoring M×N battery cells for generating battery cell information; (b) a command generating step of generating a first charge command, a first discharge command, a second charge command and a second discharge command according to the battery cell information; (c) a first voltage balance step of executing the first charge command and the first discharge command to a battery module of the M battery modules; and (d) a second voltage balance step of executing the second charge command and the second discharge command to the M battery modules.

Regarding the battery cell management and balance method, in step (c), the first charge command is executed to charge one battery cell with a lowest monitored voltage in the battery module and the first discharge command is executed to discharge another battery cell with a highest monitored voltage in the battery module.

Regarding the battery cell management and balance method, in step (d), the second charge command is executed to charge one battery module with a lowest monitored voltage among the M battery modules and the second discharge command is executed to discharge another battery module with highest monitored voltage among the M battery modules.

Regarding the battery cell management and balance method, step (c) and step (d) are performed at the same time.

In conclusion, give the aforesaid circuit, method and battery system, the present disclosure can (but not limit to) be implemented in a high voltage BEV (battery electric vehicle) power system, features a high efficiency management and balance strategy and achieves high speed voltage balance ability.

BRIEF DESCRIPTION OF THE DRAWINGS

Objectives, features, and advantages of the present disclosure are hereunder illustrated with specific embodiments in conjunction with the accompanying drawings.

DETAILED DESCRIPTION OF THE PREFERRED EMBODIMENTS

Figure 1:
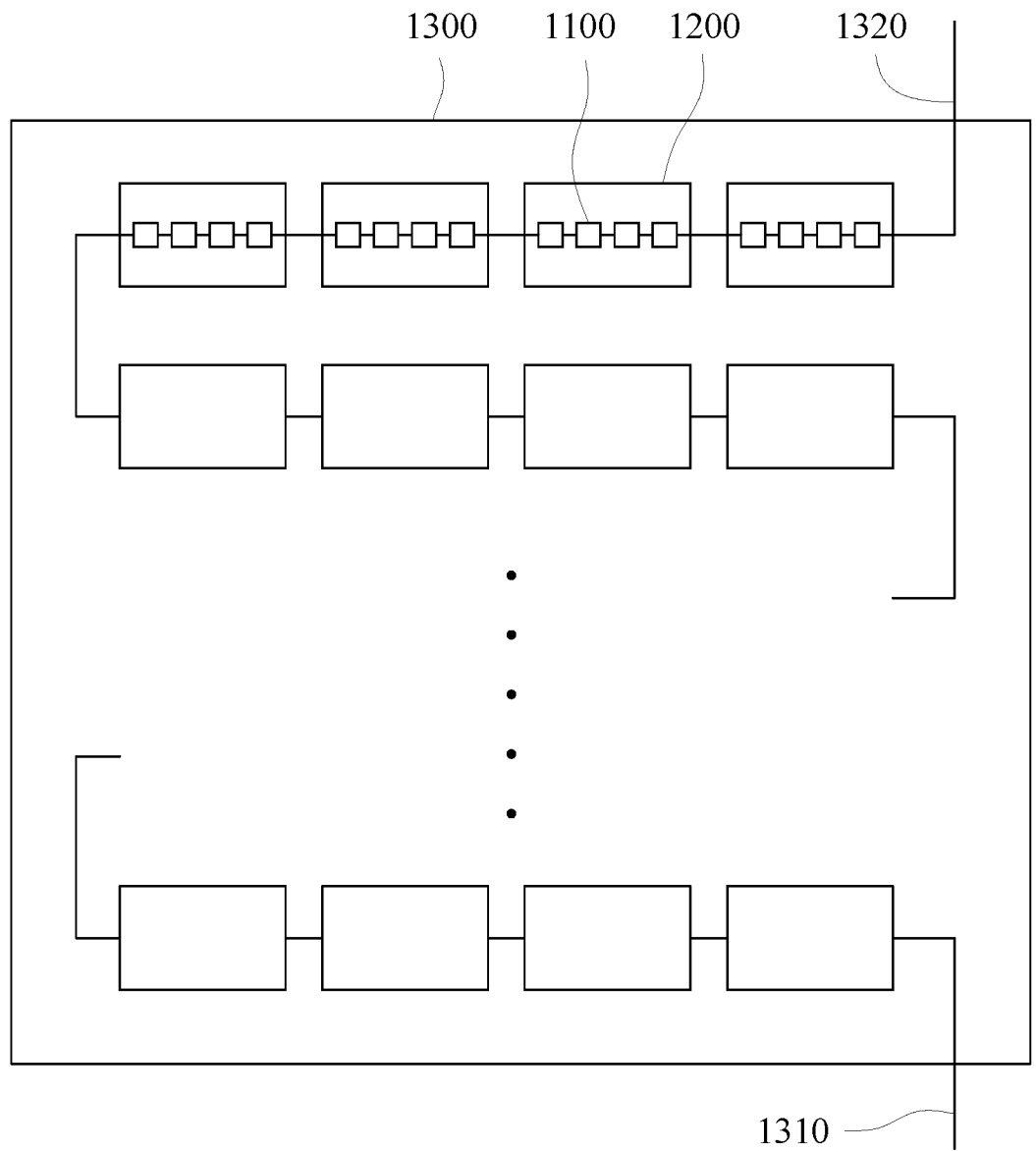
FIG. 1 shows a schematic diagram of a conventional battery system.
Figure 2:
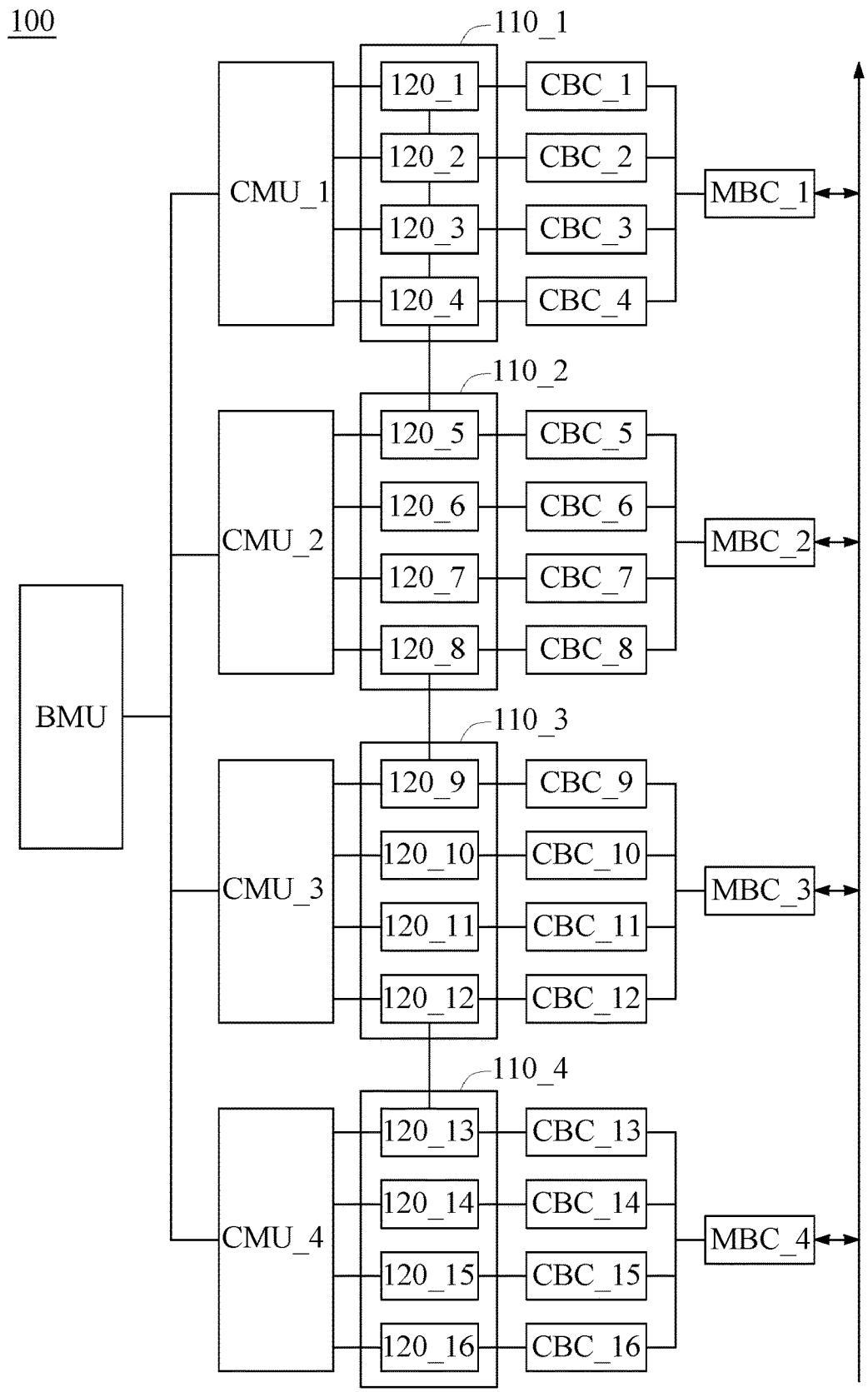
FIG. 2 is a schematic diagram of a battery cell management and balance circuit of a battery system according to an embodiment of the present disclosure.

Referring to FIG. 2, FIG. 2 is a schematic diagram of a battery cell management and balance circuit of a battery system 100 according to an embodiment of the present disclosure. The battery system 100 has 4 (M is 4 in this embodiment but can be other numbers in other possible embodiment) battery modules 110_1-110_4 connected and arranged in series. Each of battery modules has 4 (N is 4 in this embodiment but can be other numbers in other possible embodiment) battery cells 120_1-120_16 connected and arranged in series.

Therefore, in this embodiment, there is 4S4P battery pack with 59.7V (3.7V*16=59.7V) nominal output voltage. In other embodiment, nominal output voltage of 4S4P battery pack can be changed. For example, nominal output voltage can be changed to 67.2V (4.2V*16=67.2V) using 4S4P 4.2V battery cell connected and arranged in series.

In FIG. 2, the battery cell management and balance circuit comprises 16 (M*N=16) battery cell balance circuits CBC_1-CBC_16, 4 (M=4) battery cell monitor units CMU_1-CMU_4, 4 (M=4) battery module balance circuits MBC_1-MBC_4 and a battery management unit BMU.

The battery cell monitor unit CMU_1 monitors the battery cells 120_1-120_4. The battery cell monitor unit CMU_2 monitors the battery cells battery cells 120_5-120_8. The battery cell monitor unit CMU_3 monitors the battery cells battery cells 120_9-120_12. The battery cell monitor unit CMU_4 monitors the battery cells battery cells 120_13-120_16. The battery cell monitor units CMU_1-CMU_4 generate battery cell information according to monitor results. The battery cell information can include battery cell voltages, battery cell temperatures, and so on.

The battery management unit BMU connects to the battery cell monitor units CMU_1-CMU_4, respectively, for receiving the battery cell information from each battery cell monitor unit CMU_1-CMU_4. The battery management unit BMU can compute states of charge (SOC), charge and discharge voltages, charge and discharge currents for battery cells 120_1-120_16 and battery modules 110_1-110_4 according to the battery cell information. Also, the battery management unit BMU can perform module temperature protection according to battery cell temperatures of the battery cell information.

The battery management unit BMU generates a second charge command and a second discharge command according to the battery cell information to the battery module balance circuits MBC_1-MBC_4.

For example, if the monitored voltages of battery cell 120_1-120_16 are 2.0V, 2.0V, 2.0V, 2.0V, 2.1V, 2.1V, 2.1V, 2.1V, 2.2V, 2.2V, 2.2V, 2.2V, 2.3V, 2.3V, 2.3V, 2.3V, respectively, then monitored voltages of the battery modules 110_1-110_4 are 8.0V, 8.4V, 8.8V, 9.2V, respectively. In this case, the battery module 110_1 has the lowest monitored voltage (8.0V) among the battery modules 110_1-110_4 and the battery module 110_4 has highest monitored voltage (9.2V) among the battery modules 110_1-110_4. The battery management unit BMU generates the second charge command to the battery module 110_1 and the second discharge command to battery module 110_4 for voltage balance.

The battery module balance circuits MBC_1-MBC_4 connect to the battery modules 110_1-110_4 for executing the second charge command and second discharge command. In FIG. 2, the battery module balance circuit MBC_1 connects to the battery module 110_1, the battery module balance circuit MBC_2 connects to the battery module 110_2, the battery module balance circuit MBC_3 connects to the battery module 110_3 and the battery module balance circuit MBC_4 connects to the battery module 110_4.

In this case, the battery module balance circuit MBC_1 executing the second charge command for charging the battery module 110_1 and the battery module balance circuit MBC_4 executing the second discharge command for discharging the battery module 110_4. The second charge command and the second discharge command can be executed at the same time. The charge amount of the battery module 110_1 substantially can be equal to the discharge amount of the battery module 110_4, thus no or few energy wastes, and the requirement of temporary energy storage can be satisfied easily.

Each of the battery cell balance circuits CBC_1-CBC_16 connects to a battery cell of the battery cells 120_1-120_16, and is used to receive a first charge command or a first discharge command, thus achieving voltage balance of the battery cells in each of the battery modules 110_1-110_4.

Take the battery module 110_1 for example, the battery cell balance circuit CBC_1 connects to the battery cell 120_1, the battery cell balance circuit CBC_2 connects to the battery cell 120_2, the battery cell balance circuit CBC_3 connects to the battery cell 120_3 and the battery cell balance circuit CBC_4 connects to the battery cell 120_4.

If the monitored voltages of battery cells 120_1-120_4 are 2.0V, 2.1V, 2.2V, 2.3V, respectively, the battery cell monitor unit CMU_1 generates the first charge command according to battery cell information to the battery cell balance circuit CBC_1 and the first discharge command according to battery cell information to the battery cell balance circuit CBC_4. The battery cell balance circuit CBC_1 executes the first charge command for charging the battery cell 120_1 and the battery cell balance circuit MBC_4 executes the first discharge command for discharging the battery cell 120_4. The first charge command and the first discharge command can be executed at the same time. The charge amount of the battery cell 120_1 substantially can be equal to the discharge amount of the battery cell 120_4, thus no or few energy wastes, and the requirement of temporary energy storage can be satisfied easily.

FIG. 2 does not show the connection between the battery cell monitor unit CMU_1-CMU_4 and the battery cell balance circuits CBC_1-CBC_16 for the object of convenience. However, persons skilled in the art will understand that the battery cell monitor units CMU_1-CMU_4 must connect to the battery cell balance circuits CBC_1-CBC_16 in some way, for instance, directly/indirectly wire/wireless connection, for the purpose of the transmission of the first charge and discharge commands.

Also, FIG. 2 does not show the connection between the battery management unit BMU and the battery module balance circuits MBC_1-MBC_4 for the object of convenience. However, persons skilled in the art will understand that the battery management unit BMU must connect to the battery module balance circuits MBC_1-MBC_4 in some way, for instance, directly/indirectly wire/wireless connection, for the purpose of the transmission of the second charge and discharge commands.

Viewed in a certain aspect, the battery cell monitor unit CMU_1-CMU_4 and the battery cell balance circuits CBC_1-CBC_16 belong to a first level balance layer. The battery management unit BMU and the battery module balance circuits MBC_1-MBC_4 belong to a second level balance layer. Therefore, the battery cell management and balance circuit of present disclosure becomes a hierarchical management and balance circuit. The battery cell monitor units CMU_1-CMU_4 are first level management components and the battery management unit BMU is a second level management component. The battery cell balance circuits CBC_1-CBC_16 are first level balance circuits and the battery module balance circuits MBC_1-MBC_4 are second level balance circuits. The first charge and discharge commands are generated and executed in a first level voltage balance control. The second charge and discharge commands are generated and executed in a second level voltage balance control.

In other one embodiment, the hierarchical structure can have more levels of balance. Also, there is possible that the level numbers of hierarchical management components not equal to the level numbers of hierarchical balance circuits. For example, there is possible that a hierarchical structure has four levels of hierarchical management components but three levels of hierarchical balance circuits.

Figure 3:
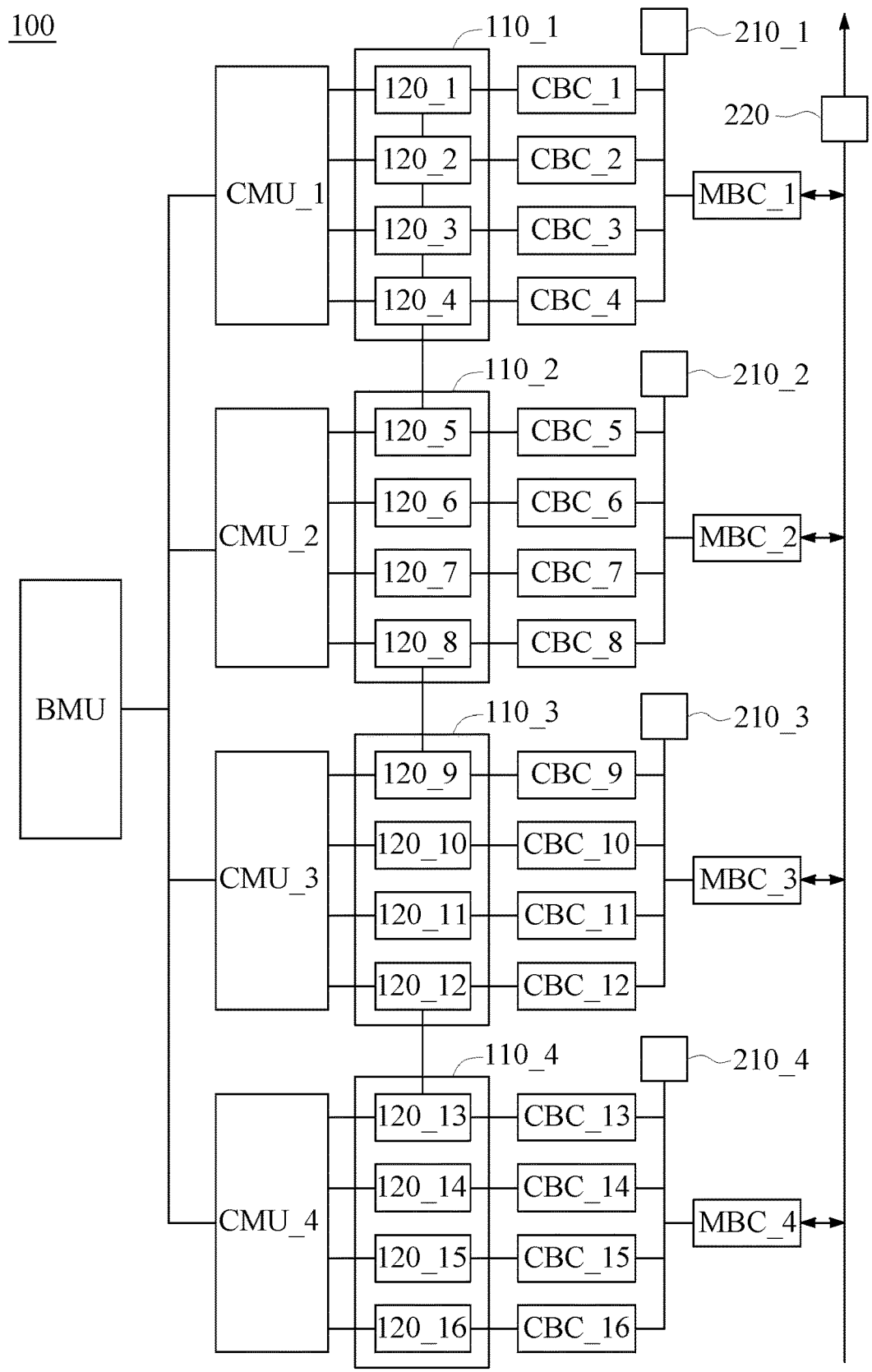
FIG. 3 is a schematic diagram of a battery cell management and balance circuit of a battery system according to another one embodiment of the present disclosure.

Referring to FIG. 3, FIG. 3 is a schematic diagram of a battery cell management and balance circuit of a battery system according to another one embodiment of the present disclosure. The battery cell management and balance circuit of FIG. 3 is roughly the same as the battery cell management and balance circuit of FIG. 2, but the battery cell management and balance circuit of FIG. 3 further comprises four first temporary energy storage units 210_1-210_4 and a second temporary energy storage unit 220. The first temporary energy storage units 210_1-210_4 can be implemented by lower capacity capacitances or capacitance and inductance (RC) circuits. The second temporary energy storage unit 220 can be implemented by higher capacity capacitances or capacitance and inductance (RC) circuits.

The first temporary energy storage unit 210_1 meets the requirement of temporary energy storage/release raised from voltage balance actions of the battery cell balance circuits CBC_1-CBC_4. The first temporary energy storage unit 210_2 meets the requirement of temporary energy storage/ release raised from voltage balance actions of the battery cell balance circuits CBC_5-CBC_8. The first temporary energy storage unit 210_3 meets the requirement of temporary energy storage/release raised from voltage balance actions of the battery cell balance circuits CBC_9-CBC_12. The first temporary energy storage unit 210_4 meets the requirement of temporary energy storage/release raised from voltage balance actions of the battery cell balance circuits CBC_13-CBC_16.

For example, the first temporary energy storage units 210_1-210_4 can temporary store energy when the first discharge command is executed before the first charge command is executed, and the first temporary energy storage units 210_1-210_4 can temporary release energy when the first charge command is executed before the first discharge command is executed.

For example, the battery cell monitor units CMU_1-CMU_4 can only generate the first charge command or the first discharge command by the help of store/release energy of the first temporary energy storage units 210_1-210_4.

The second temporary energy storage unit 220 meets the requirement of temporary energy storage/release raised from voltage balance actions of the battery module balance circuits MBC_1-MBC_4.

For example, the second temporary energy storage units 220 can temporary store energy when the second discharge command is executed before the second charge command is executed, and the second temporary energy storage units 220 can temporary release energy when the second charge command is executed before the second discharge command is executed.

For example, the battery management unit BMU can only generate the second charge command or the second discharge command by the help of store/release energy of the second temporary energy storage unit 220.

Viewed in the certain aspect, the first temporary energy storage units 210_1-210_4 belong to the first level balance layer and the second temporary energy storage units 220 belong to the second level balance layer.

The description above about the battery cell management and balance circuit of FIG. 2 shows the numbers of the first charge command and the first discharge command are 1, respectively, and can be executed at the same time. The description above about the battery cell management and balance circuit of FIG. 3 shows that only one first charge command or first discharge command can be generated and executed in the same battery module. However, the present disclosure does not limit to the two embodiments above. Both of the numbers of the first charge commands and the first discharge commands can be 2 (or more), respectively, and the numbers of the first charge commands and the first discharge commands can be different.

For example, the battery cell monitor unit CMU_2 can generate two first charge command to battery cell balance circuits CBC_5-CBC_6 respectively, and two first discharge command to battery cell balance circuits CBC_7-CBC_8, respectively given that the monitored voltages of battery cells 120_5-120_8 are 2.0V, 2.2V, 2.4V, 2.6V, respectively.

The description above about the battery cell management and balance circuit of FIG. 2 shows the numbers of the second charge command and the second discharge command are 1, respectively, and can be executed at the same time. The description above about the battery cell management and balance circuit of FIG. 3 shows that only one second charge command or second discharge command can be generated and executed. However, the present disclosure does not limit to the two embodiments above. Both of the numbers of the second charge commands and the second discharge commands can be 2 (or more) respectively, and the numbers of the second charge commands and the second discharge commands can be different.

For example, the battery management unit BMU can generate two first charge command to battery module balance circuits MBC_1-MBC_2, respectively, and two first discharge command to battery module balance circuits MBC_3-MBC_4, respectively given that the monitored voltages of battery module 110_1-110_4 are 8.0V, 8.8V, 9.6V, 10.4V, respectively.

Figure 4:
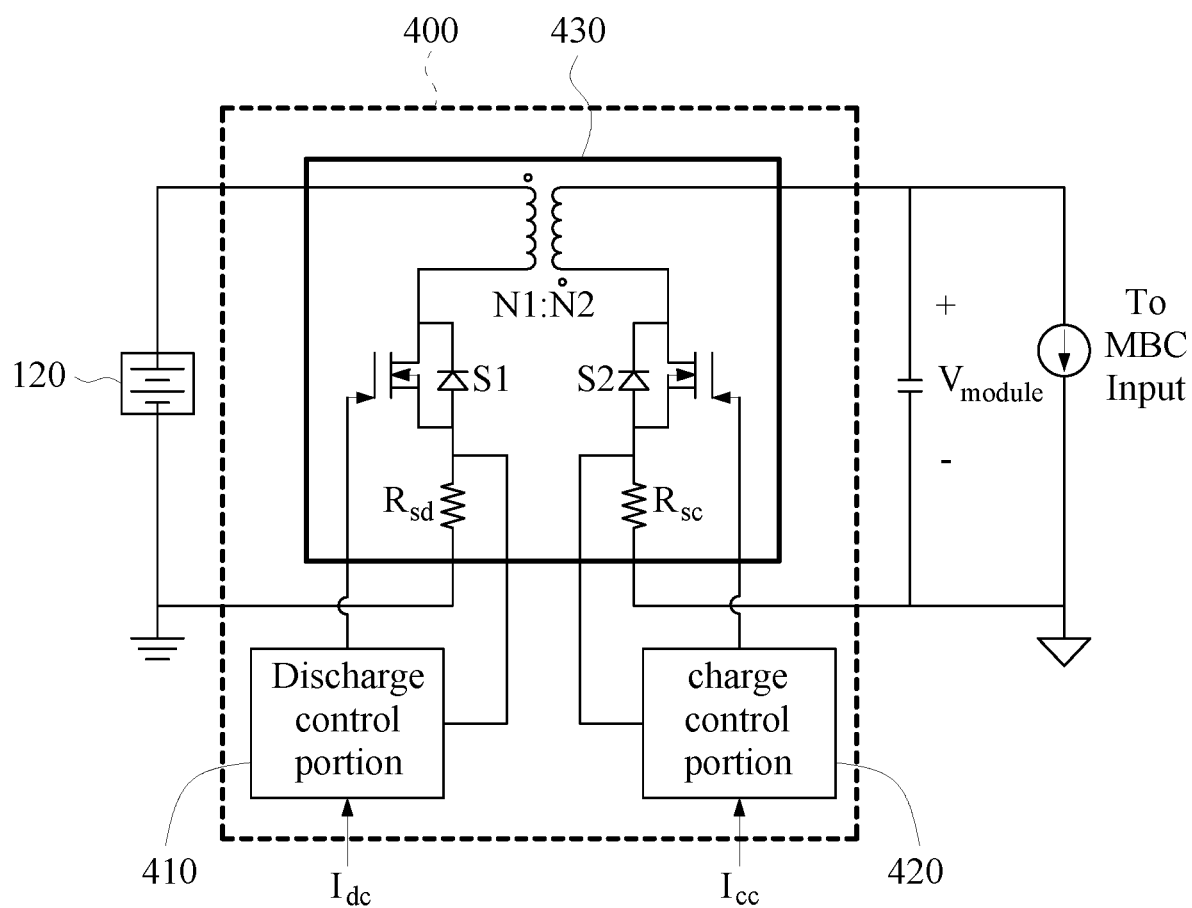
FIG. 4 is a schematic diagram of a battery cell balance circuit according to an embodiment of the present disclosure.

Referring to FIG. 4, FIG. 4 is a schematic diagram of a battery cell balance circuit according to an embodiment of the present disclosure. The battery cell balance circuit 400 which has two sides respectively connected to the battery cell 120 and the voltage of the battery module balance circuits MBC (or input or output ends of MBC) has a discharge control portion 410, a charge control portion 420 and a fly-back converter 430. The fly-back converter 430 includes a first order side switch S1, a second order side switch S2, a first resistance $R_{sd}$, a second resistance $R_{sc}$ and a coil.

The discharge control portion 410 can receive the first discharge command $I_{dc}$ from the connected battery cell monitor unit CMU in a peak current control mode. The battery cell balance circuit CBC executes the first discharge command $I_{dc}$ and turns on the first order side switch S1, while the second order side switch S2 is still in a cutoff state.

The charge control portion 420 can receive the first charge command $I_{cc}$ from the connected battery cell monitor unit CMU in the peak current control mode. The battery cell balance circuit CBC executes the first charge command $I_{cc}$ and turns on the second order side switch S2, while the first order side switch S1 is still in a cutoff state.

Figure 5:
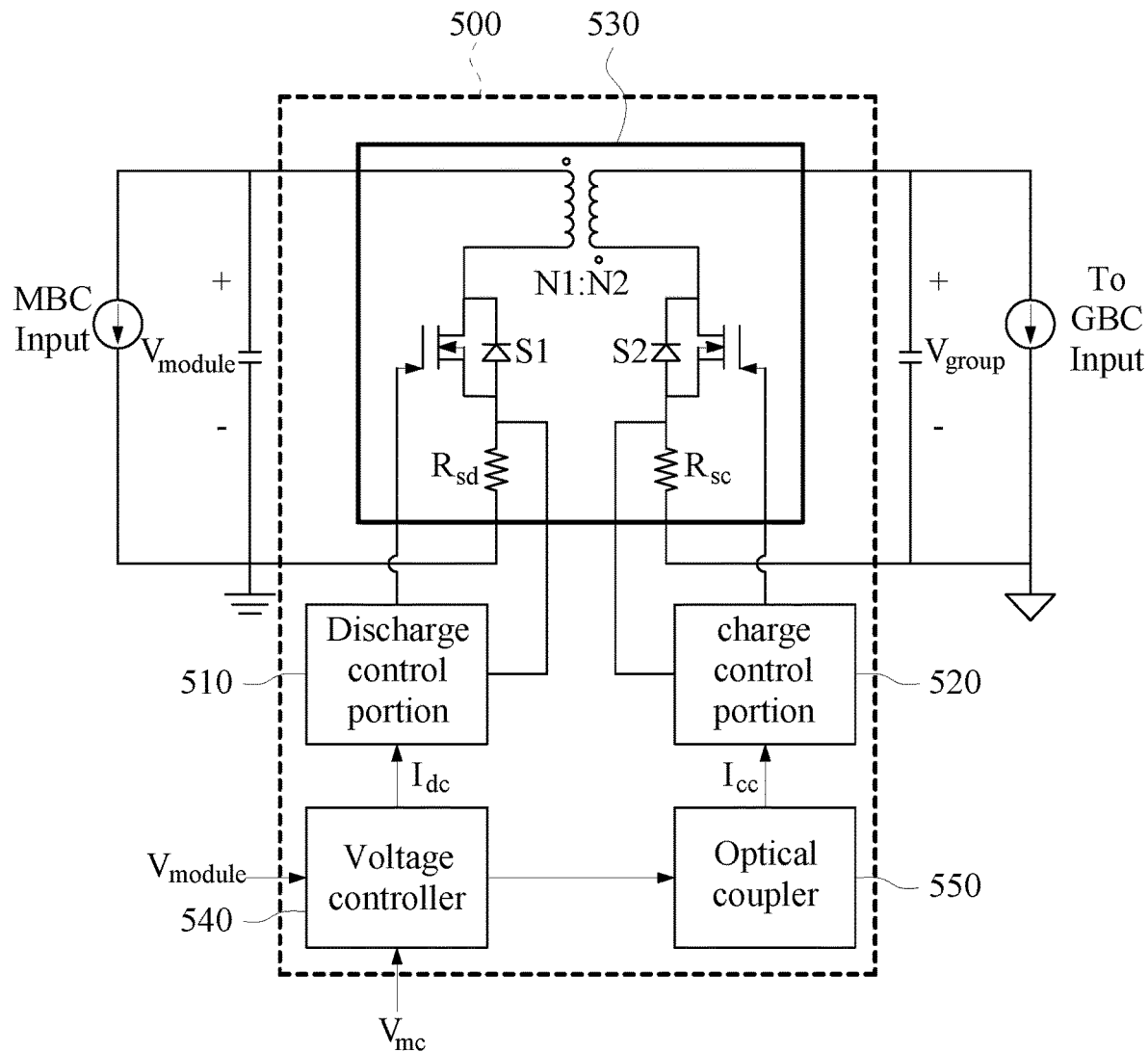
FIG. 5 is a schematic diagram of a battery module balance circuit according to an embodiment of the present disclosure.

Referring to FIG. 5, FIG. 5 is a schematic diagram of a battery module balance circuit according to an embodiment of the present disclosure. In FIG. 5, two sides of the battery module balance circuit 500 are respectively connected to the voltage of the battery module balance circuit MBC (or input ends of MBC) and the voltage of the battery group balance circuit GBC (or input ends of GBC) which is exemplary third level balance circuit and connects to all of the battery module balance circuit MBC. In other possible embodiments, two sides of the battery module balance circuit 500 are respectively connected to the voltage of the battery module balance circuit MBC (or input or output ends of MBC) and an input end (or an output end) of the battery system.

The battery module balance circuit 500 has a discharge control portion 510, a charge control portion 520, a fly-back converter 530, a voltage controller 540 and an optical coupler 550. The fly-back converter 530 includes a first order side switch S1, a second order side switch S2, a first resistance $R_{sd}$, a second resistance $R_{sc}$ and a coil. The voltage controller 540 can receive the voltage command $V_{mc}$ from the battery management unit BMU and generate the second discharge command $I_{dc}$ or the second charge command $I_{cc}$. The voltage controller 540 can generate the second charge command $I_{cc}$ by the function of the optical coupler 550. Specifically, the voltage controller 540 can compare the voltage command $V_{mc}$ with the voltage of the battery group. The second discharge command $I_{dc}$ is generated when the voltage value of voltage command $V_{mc}$ less than the voltage value of the battery module. The second charge command $I_{cc}$ is generated when the voltage value of voltage command $V_{mc}$ more than the voltage value of the battery module. The voltage value of voltage command $V_{mc}$ can be the average voltage value of four battery modules.

The discharge control portion 510 can receive the second discharge command $I_{dc}$ in a peak current control mode. The battery module balance circuit MBC executes the second discharge command $I_{ds}$ and turns on the first order side switch S1, while the second order side switch S2 is still in a cutoff state.

The charge control portion 520 can receive the second discharge command $I_{cc}$ in the peak current control mode. The battery module balance circuit MBC executes the second charge command $I_{cc}$ and turns on the second order side switch S2, while the first order side switch S1 is still in a cutoff state.

In FIG. 5, the battery management unit BMU generates the second discharge command $I_{dc}$ or the second discharge command $I_{cc}$ through the voltage controller 540 and the optical coupler 550, that is, the battery management unit BMU generates the second discharge command $I_{dc}$ or the second discharge command $I_{cc}$ indirectly. However, in other possible embodiment of the present disclosure (not shown), the discharge control portion 510 can receive the first discharge command $I_{dc}$ directly from the battery management unit BMU and the charge control portion 520 can also receive the second discharge command $I_{cc}$ directly from the battery management unit BMU. In that embodiment, the voltage controller 540 and the optical coupler 550 are not necessary.

Further, a part or all the battery cell monitor units CMU_1-CMU_4 can not generate the first charge and discharge commands when the difference voltage value between highest and lowest monitored voltage among the four corresponding battery cell balance circuits does not reach a first threshold value.

The first threshold value can equal to 5% of the lowest monitored voltage among the four corresponding battery cell balance circuits.

For example, if the monitored voltages of battery cells 120_1-120_4 are 2.0V, 2.03V, 2.06V, 2.09V, respectively, the battery cell monitor unit CMU_1 can not generate the first charge and discharge commands because the difference voltage value (0.09/2=4.5%) does not reach the first threshold value (5% in this example).

Further, the battery management unit BMU can not generate the second charge and discharge commands when the difference voltage value between highest and lowest monitored voltage among the four corresponding battery module balance circuits does not reach a second threshold value.

The second threshold value can equal to 5% of the lowest monitored voltage among the four corresponding battery module balance circuits.

For example, if the monitored voltages of battery modules 110_1-110_4 are 10.0V, 10.15V, 10.30V, 10.45V, respectively, the battery management unit BMU can not generate the second charge and discharge commands because the difference voltage value (0.45/10=4.5%) does not reach the second threshold value (5% in this example).

The first threshold value or the second threshold value can be a fixed value. For instance, the first threshold value can be 0.05V, 0.1V, or a value between 0.05V to 0.1V. For instance, the second threshold value can be 0.2V, 0.4V, or a value between 0.2V to 0.4V.

A purpose of setting the first threshold value or the second threshold value is avoiding power consumption. Specifically, the voltage unbalance between the battery cells or battery modules is rather slight when the difference voltage value does not reach the first threshold value or the second threshold value. Slight voltage unbalance can be tolerated because of the actions of generating and executing the first and second commands may cause unworthy power consumption.

The battery cell monitor units CMU_1-CMU_4 can estimate the voltage unbalance degree every 5 minutes. The cell monitor units CMU_1-CMU_4 can stop generating the first charge and discharge commands for 5 minutes when the comparison result between the difference voltage value and the first threshold value is true (e.g. the difference voltage value does not reach the first threshold value).

The battery management unit BMU can estimate the voltage unbalance degree every 5 minutes. The battery management unit BMU can stop generating the second charge and discharge commands for 5 minutes when the comparison result between the difference voltage value and the second threshold value is true (e.g. the difference voltage value does not reach the second threshold value).

Further, the first level voltage balance actions and the second level voltage balance actions can be performed at the same time. For example, the battery cell monitor units CMU_3-CMU_4 can perform the first level voltage balance within the battery modules 120_3-120_4 and the battery management unit BMU can perform the second level voltage balance among four the battery modules 120_1-120_4.

The battery system of the present disclosure is suitable for applying to a BEV (battery electric vehicle) power system. The battery system of the present disclosure is especially suitable for an electric bus power system which requires high output voltage, for example, 600V, to drive electric bus motor. With the numbers of battery cells and the battery modules increases, the benefit of using the battery cell management and balance circuit and battery system of the present disclosure to improve voltage imbalance more appears.

Further, the battery system of the present disclosure can be installed in an electric bus and perform the first and second level voltage balance when the electric bus traveling. In this case, the first and second level voltage balance process is purely energy transmission within the battery module or between the battery modules because of no additional power being charged or discharged to the battery system.

Figure 6:
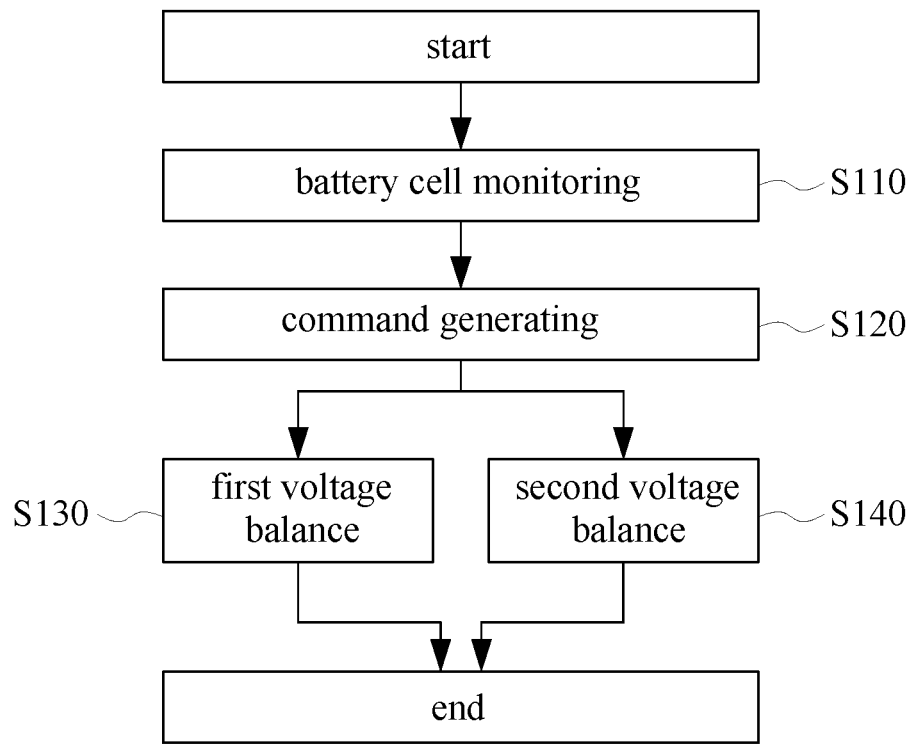
FIG. 6 is a flow chart of a battery cell management and balance method according to an embodiment of the present disclosure.

Referring to FIG. 6, FIG. 6 is a flow chart of a battery cell management and balance method according to a embodiment of the present disclosure. The battery cell management and balance method can be implemented in a battery system.

In FIG. 6, the battery cell management and balance method comprises a battery cell monitoring step S110 of monitoring M×N battery cells for generating battery cell information, a command generating step S120 of generating a first charge command, a first discharge command, a second charge command and a second discharge command according to the battery cell information, a first voltage balance step S130 of executing the first charge command and the first discharge command to a battery module of the M battery modules and a second voltage balance step S140 of executing the second charge command and the second discharge command to the M battery modules. The first voltage balance step S130 and the second voltage balance step S140 can be performed at the same time.

The battery cell monitoring step S110 can be performed by the M battery cell monitor units CMU. The command generating step S120 can be performed by the M battery cell monitor units CMU and the battery management unit BMU. The first voltage balance step S130 can be performed by the M×N battery cell balance circuits CBC. The second voltage balance step S140 can be performed by the M battery module balance circuits MBC.

In the first voltage balance step S130, the first charge command can be executed to charge one battery cell with lowest monitored voltage in the battery module and the first discharge command can be executed to discharge another battery cell with highest monitored voltage in the battery module.

In the second voltage balance step S140, the second charge command can be executed to charge one battery module with lowest monitored voltage between the M battery modules and the second discharge command can be executed to discharge another battery module with highest monitored voltage among the M battery modules.

Figure 7:
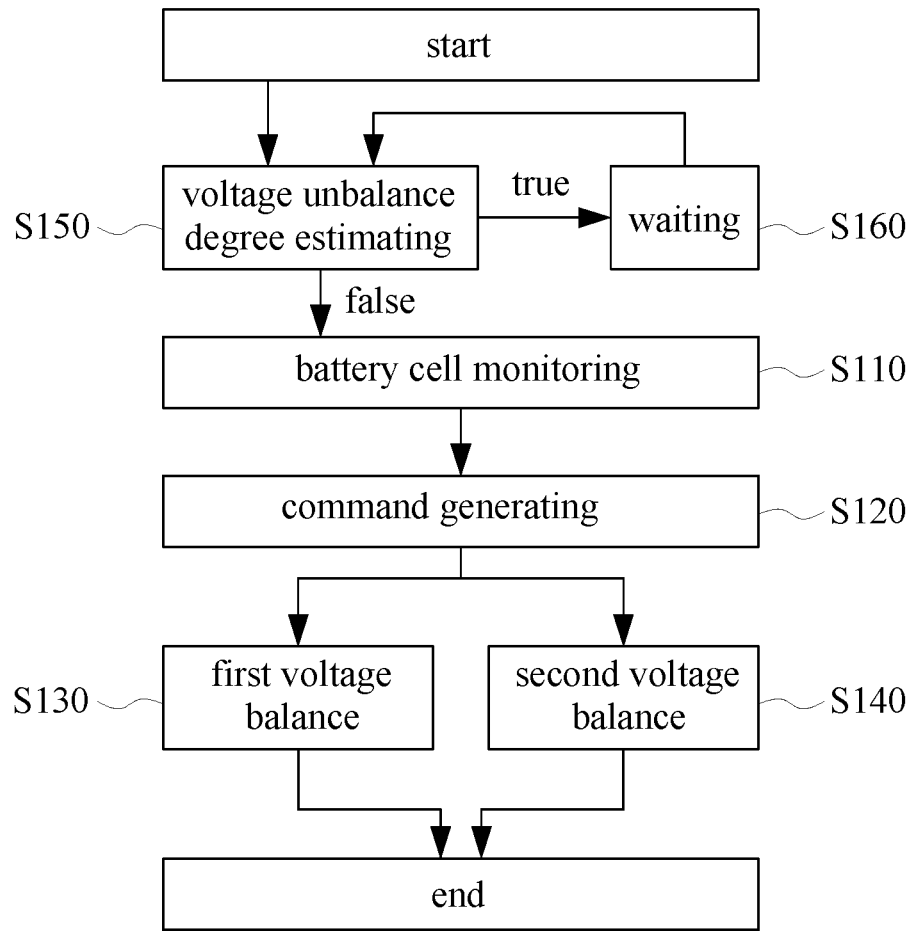
FIG. 7 is a flow chart of a battery cell management and balance method according to another one embodiment of the present disclosure.

Referring to FIG. 7, FIG. 7 is a flow chart of a battery cell management and balance method according to another one embodiment of the present disclosure. The battery cell management and balance method of this embodiment further comprises an estimate step S150 of estimating the voltage unbalance degree and a waiting step S160 of waiting for a default time.

The estimate step S150 can be performed by the M battery cell monitor units CMU and the battery management unit BMU. The estimate results of a part of the M battery cell monitor units CMU and/or the battery management unit BMU can be true (e.g. the voltage unbalance degree remains in tolerance) while the estimate results of the other battery cell monitor units CMU and/or the battery management unit BMU can be false (e.g. the voltage unbalance degree is beyond tolerance).

The waiting step S160 can be performed by a part of the M battery cell monitor units CMU and/or the battery management unit BMU which its estimate results are true. The default time of waiting can be 5 minutes. The part of the M battery cell monitor units CMU and/or the battery management unit BMU can go back to the estimate step S150 when the default time of waiting is over.

In conclusion, give the aforesaid structure, method and battery system, present disclosure can (but not limit to) be implemented in a high voltage BEV power system, features a high efficiency management and balance strategy and achieves high speed voltage balance ability.

The present disclosure is disclosed above by preferred embodiments. However, persons skilled in the art should understand that the preferred embodiments are illustrative of the present disclosure only, but should not be interpreted as restrictive of the scope of the present disclosure. Hence, all equivalent modifications and replacements made to the aforesaid embodiments should fall within the scope of the present disclosure. Accordingly, the legal protection for the present disclosure should be defined by the appended claims.

What is claimed is:

1. A battery cell management and balance circuit implemented in a battery system, the battery system having M battery modules connected and arranged in series, each of battery modules having N battery cells connected and arranged in series, the battery cell management and balance circuit comprising:
M×N battery cell balance circuits, each of them connecting to a battery cell of the M×N battery cells for executing first charge or discharge commands to the connected battery cell, each of the M×N battery cell balance circuits comprising:
a fly-back converter, connected to the battery cell of the M×N battery cells;
a discharge control portion, connected to the fly-back converter and receiving the first discharge command in a peak current control mode to enable the fly-back converter; and
a charge control portion, connected to the fly-back converter and receiving the first charge command in the peak current control mode to enable the fly-back converter;
M battery cell monitor units, each of them monitoring N battery cells of the M×N battery cells and corresponding to the N battery cell balance circuits connected to the N battery cell for generating battery cell information and the first charge or discharge commands;
M battery module balance circuits, each of them connecting to a battery module of the M battery modules for executing charge or discharge to the entire battery module according to second charge or discharge commands; and
a battery management unit connecting to the M battery cell monitor units for receiving battery cell information from each battery cell monitor unit and the M battery module balance circuits for directly or indirectly generating the second charge or discharge commands to the M battery module balance circuits;
wherein the battery cell monitor unit of the M battery cell monitor units does not generate the first charge and discharge commands when a difference voltage value between highest and lowest monitored voltages among the N corresponding battery cell balance circuits does not reach a first threshold value; and
wherein the battery management unit does not generate the second charge and discharge commands when a difference voltage value between highest and lowest monitored voltages among the M corresponding battery module balance circuits does not reach a second threshold value.

2. The battery cell management and balance circuit of claim 1, wherein each of the battery cell monitor units generates the first charge command to one battery cell balance circuit with a lowest monitored voltage among the N corresponding battery cell balance circuits and the first discharge command to another battery cell balance circuit with a highest monitored voltage among the N corresponding battery cell balance circuits.

3. The battery cell management and balance circuit of claim 2, wherein the battery management unit generates the second charge command to one battery module balance circuit with a lowest monitored voltage among the M corresponding battery module balance circuits and the second discharge command to another battery module balance circuit with a highest monitored voltage among the N corresponding battery module balance circuits.

4. A battery system comprising:
M battery modules connected and arranged in series, each of battery modules having N battery cells connected and arranged in series;
M×N battery cell balance circuits, each of them connecting to a battery cell of the M×N battery cells for executing a first charge or discharge command to the connected battery cell, each of the M×N battery cell balance circuits comprising:
a fly-back converter, connected to the battery cell of the M×N battery cells;
a discharge control portion, connected to the fly-back converter and receiving the first discharge command in a peak current control mode to enable the fly-back converter; and a charge control portion, connected to the fly-back converter and receiving the first charge command in the peak current control mode to enable the fly-back converter;

M battery cell monitor units, each of them monitoring N battery cells of the M×N battery cells and corresponding to the N battery cell balance circuits connected to the N battery cell for generating battery cell information and the first charge or discharge commands;

M battery module balance circuits, each of them connecting to a battery module of the M battery modules for executing charge or discharge to the entire battery module according to a second charge or discharge command; and a battery management unit connecting to the M battery cell monitor units for receiving battery cell information from each battery cell monitor unit and the M battery module balance circuits for directly or indirectly generating the second charge or discharge commands to the M battery module balance circuits;

wherein the battery cell monitor unit of the M battery cell monitor units does not generate the first charge and discharge commands when a difference voltage value between highest and lowest monitored voltages among the N corresponding battery cell balance circuits does not reach a first threshold value; and wherein the battery management unit does not generate the second charge and discharge commands when a difference voltage value between highest and lowest monitored voltages among the M corresponding battery module balance circuits does not reach a second threshold value.

5. The battery system of claim 4, wherein each of the battery cell monitor units generates the first charge command to one battery cell balance circuit with a lowest monitored voltage among the N corresponding battery cell balance circuits and the first discharge command to another battery cell balance circuit with a highest monitored voltage among the N corresponding battery cell balance circuits.

6. The battery system of claim 5, wherein the battery management unit generates the second charge command to one battery module balance circuit with a lowest monitored voltage among the M corresponding battery module balance circuits and the second discharge command to another battery module balance circuit with a highest monitored voltage among the N corresponding battery module balance circuits.

7. The battery system of claim 4, wherein the first threshold value equals to 5% of the lowest monitored voltages among the N corresponding battery cell balance circuits.

8. The battery system of claim 4, wherein the second threshold value equals to 5% of the lowest monitored voltages among the M corresponding battery module balance circuits.

9. A battery cell management and balance method implemented in a battery system, the battery system having M battery modules connected and arranged in series, each of the battery modules having N battery cells connected and arranged in series, the battery cell management and balance method comprising following steps:
   (a) monitoring M×N battery cells for generating battery cell information;
   (b) generating a first charge command, a first discharge command, a second charge command and a second discharge command according to the battery cell information;
   (c) executing the first charge command and the first discharge command to a battery module of the M battery modules, each one of the battery cells of the battery module connected to a battery cell balance circuit that comprising a fly-back converter connected to the battery cell, a discharge control portion connected to the fly-back converter and receiving the first discharge command in a peak current control mode to enable the fly-back converter and a charge control portion connected to the fly-back converter and receiving the first charge command in the peak current control mode to enable the fly-back converter; and
   (d) executing the second charge command and the second discharge command to the M battery modules for charging or discharging the entire battery module; and
   (e) not generating the first charge command and the first discharge command when a difference voltage value between highest and lowest monitored voltages among N corresponding battery cell balance circuits does not reach a first threshold value and not generating the second charge command and the second discharge command when a difference voltage value between highest and lowest monitored voltages among M corresponding battery module balance circuits does not reach a second threshold value.

10. The battery cell management and balance method of claim 9, wherein, in step (c), the first charge command is executed to charge one battery cell with a lowest monitored voltage in the battery module and the first discharge command is executed to discharge another battery cell with a highest monitored voltage in the battery module.

11. The battery cell management and balance method of claim 10, wherein, in step (d), the second charge command is executed to charge one battery module with a lowest monitored voltage among the M battery modules and the second discharge command is executed to discharge another battery module with a highest monitored voltage between the M battery modules.

12. The battery cell management and balance method of claim 11, wherein step (c) and step (d) are performed at the same time.

* * * * *